United States Patent
Fang et al.

(10) Patent No.: US 10,062,791 B2
(45) Date of Patent: Aug. 28, 2018

(54) SELF-ALIGNED METAL OXIDE THIN FILM TRANSISTOR AND METHOD OF MAKING SAME

(71) Applicant: HON HAI PRECISION INDUSTRY CO., LTD., New Taipei (TW)

(72) Inventors: Kuo-Lung Fang, Hsinchu (TW); Yi-Chun Kao, Hsinchu (TW); Po-Li Shih, Hsinchu (TW); Chih-Lung Lee, Hsinchu (TW); Hsin-Hua Lin, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/162,561

(22) Filed: May 23, 2016

(65) Prior Publication Data

US 2016/0268444 A1    Sep. 15, 2016

Related U.S. Application Data

(62) Division of application No. 14/591,189, filed on Jan. 7, 2015, now Pat. No. 9,379,251.

(30) Foreign Application Priority Data

Dec. 30, 2014  (TW) .............................. 103146383 A

(51) Int. Cl.
*H01L 29/66* (2006.01)
*H01L 29/786* (2006.01)
*H01L 21/425* (2006.01)

(52) U.S. Cl.
CPC ...... *H01L 29/78696* (2013.01); *H01L 21/425* (2013.01); *H01L 29/66765* (2013.01); *H01L 29/66969* (2013.01); *H01L 29/7869* (2013.01)

(58) Field of Classification Search
CPC .......................... H01L 27/127; H01L 27/1225
See application file for complete search history.

(56) References Cited

U.S. PATENT DOCUMENTS

2006/0008932 A1 * 1/2006 Oh ...................... G02F 1/13454
                                                          438/34
2011/0204362 A1   8/2011 Akimoto et al.
(Continued)

FOREIGN PATENT DOCUMENTS

| CN | 1725510 A | 1/2006 |
|---|---|---|
| CN | 102763202 A | 10/2012 |
| CN | 103545378 A | 1/2014 |

*Primary Examiner* — Tran Tran
(74) *Attorney, Agent, or Firm* — ScienBiziP, P.C.

(57) ABSTRACT

A thin film transistor comprises a substrate, a gate electrode formed on the substrate, an electrically insulating layer covering the gate electrode, a channel layer made of a semiconductor material and formed on the electrically insulating layer, a source electrode formed on a first lateral side of the electrically insulating layer, and a drain electrode formed on an opposite second lateral side of the electrically insulating layer. The source electrode has an inner end covering a first outer end of the channel layer and electrically connecting therewith. The drain electrode has an inner end covering an opposite second outer end of the channel layer and electrically connecting therewith. An area of the channel layer adjacent to and not covered by one of the source electrode and the drain electrode has an electrical conductivity lower than the electrical conductivity of other area of the channel layer.

10 Claims, 13 Drawing Sheets

(56) References Cited

U.S. PATENT DOCUMENTS

2012/0115286 A1* 5/2012 Kuniyoshi ........ H01L 29/78621
  438/158
2015/0340504 A1 11/2015 Choi et al.

* cited by examiner

SELF-ALIGNED METAL OXIDE THIN FILM TRANSISTOR AND METHOD OF MAKING SAME

CROSS-REFERENCE TO RELATED APPLICATIONS

This application is a divisional application of U.S. Ser. No. 14/591,189, filed Jan. 7, 2015 the contents of which are hereby incorporated by reference. The patent application Ser. No. 14/591,189 in turn claims the benefit of priority under 35 USC 119 from Taiwan Patent Application No. 103146383, filed on Dec. 30, 2014.

FIELD

The subject matter herein generally relates to a thin film transistor, and particularly to a self-aligned metal oxide thin film transistor (TFT) having better hot-carrier/breakdown resistant capability. The present disclosure is also related to a method for manufacturing such self-aligned metal oxide TFT.

BACKGROUND

In manufacturing metal oxide TFT, the carrier channel formed by metal oxide is easily damaged when wet etching metal to form source electrode and drain electrode. Conventionally it requires forming an etching stop on the carrier channel to protect the carrier channel from the wet etching. The provision of the etching stop not only increases the thickness of the TFT, but also increases the cost of the TFT.

Furthermore, following the increase of definition of the liquid crystal display (LCD), the TFT is made smaller and smaller which cause the current density in the TFT to be increased. The high current density in the TFT can generate hot-carrier effect. The hot-carrier effect is very harmful to electronic component, which may result in a malfunction of the TFT.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present self-aligned metal oxide TFT. Moreover, in the drawings, like reference numerals designate corresponding parts throughout the several views.

DETAILED DESCRIPTION

Figure 1:
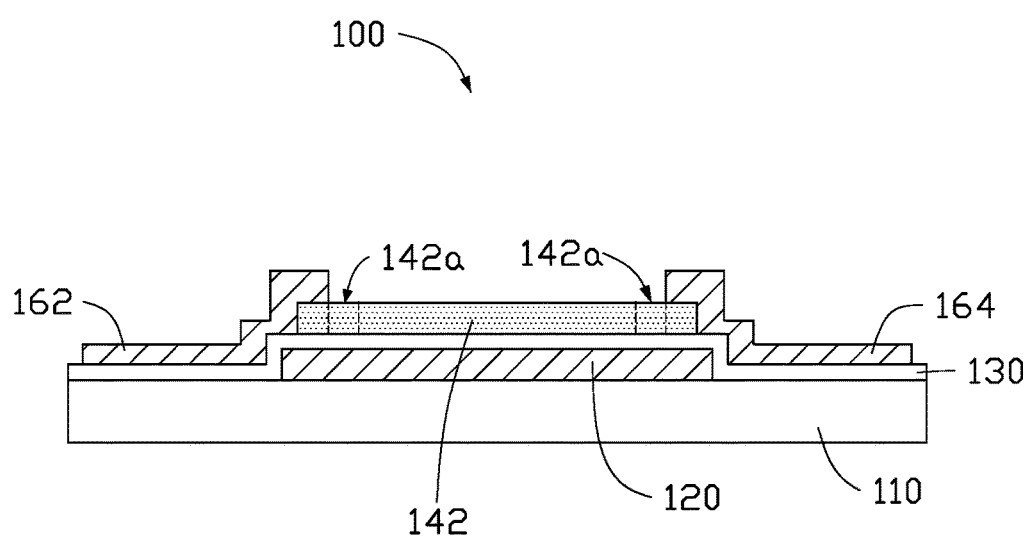
FIG. 1 is a cross-sectional view showing a self-aligned metal oxide TFT in accordance with the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Referring to FIG. 1, a self-aligned metal oxide thin film transistor (TFT) 100 in accordance with an embodiment of the present disclosure includes a substrate 110, a gate electrode 120 over a middle of the substrate 110, an electrically insulating layer 130 over the substrate 110 and the gate electrode 120, a channel layer 142 over a middle of the electrically insulating layer 130, and a source electrode 162 and a drain electrode 164 located at two opposite sides of the electrically insulating layer 130, respectively. The electrically insulating layer 130 totally covers the gate electrode 120 to insulate the gate electrode 120 from the source and drain electrodes 162, 164 and the channel layer 142. The channel layer 142 is located above the gate electrode 120 and aligned therewith and interconnects the source and drain electrodes 162, 164. An inner end of the source electrode 162 extends inwardly to cover a corresponding outer edge of the channel layer 142 and electrically connect therewith. An inner end of the drain electrode 164 extends inwardly to cover a corresponding outer edge of the channel layer 142 and electrically connect therewith. The channel layer 142 includes two low conductive areas 142a each being located near a corresponding one of the source electrode 162 and the drain electrode 164, but not covered thereby. The low conductive areas 142a have an electrical conductivity which is lower than other areas of the channel layer 142. In at least one embodiment, the low conductivity is obtained by causing the low conductive areas 142a to have higher charge carrier concentration than the other areas of the channel layer 142. In another embodiment, the low conductivity of the low conductive areas 142a is obtained by causing the low conductive areas 142a to have higher electrical resistance than the other areas of the channel layer 142. In still another embodiment, the low conductivity of the low conductive areas 142a is obtained by causing the low conductive areas 142a to have a lower electron migration rate than the other areas of the channel layer 142.

The speed of electrons flowing though the low conductive areas 142a of the channel layer 142 will be reduced, whereby the hot-carrier effect can be restrained. Thus, a stability and reliability of the TFT 100 can be enhanced.

Figure 2:
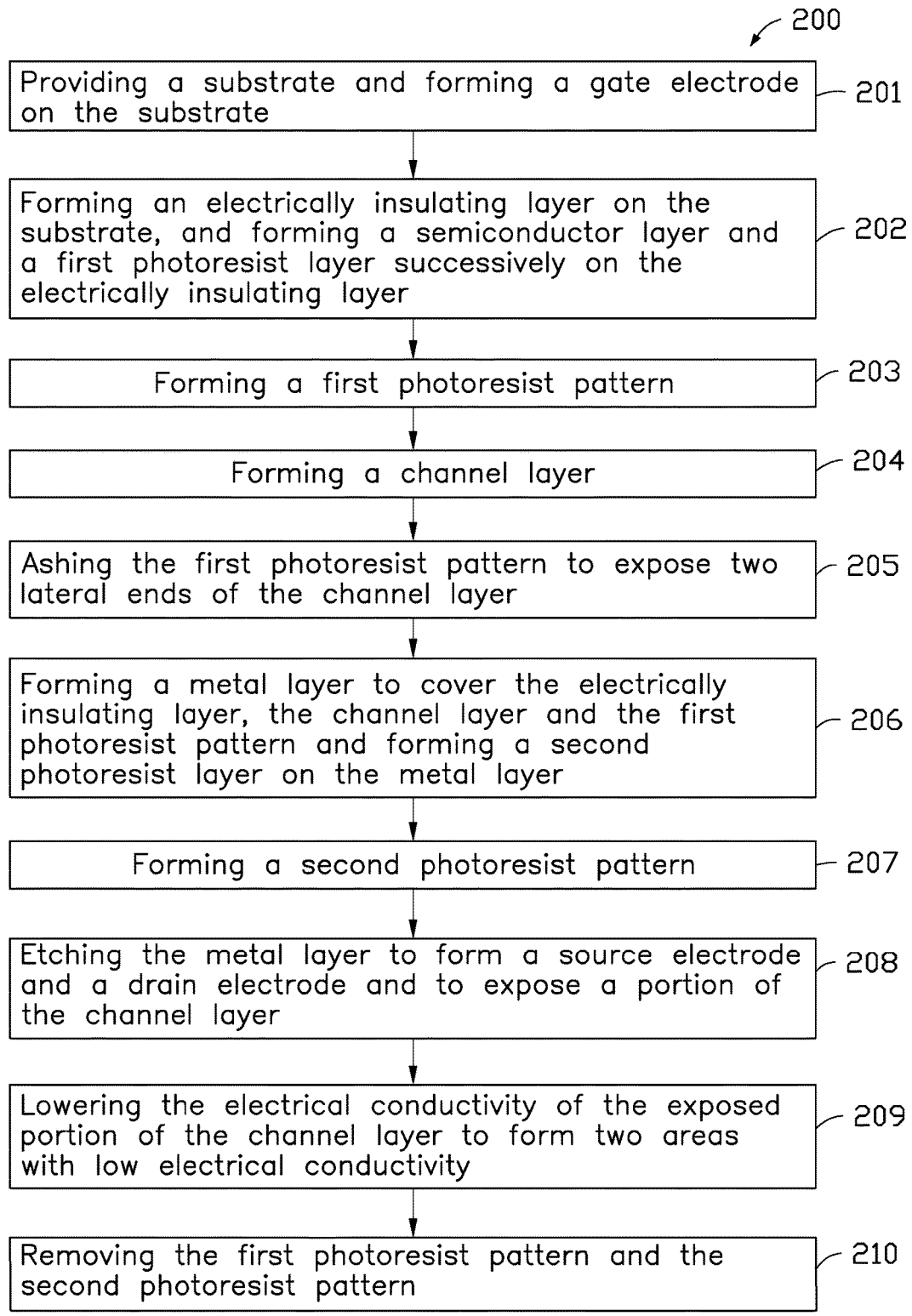
FIG. 2 is a flowchart showing a method for forming the TFT of FIG. 1 in accordance with the present disclosure.

Referring to FIG. 2, a flowchart of an example method 200 for manufacturing the TFT 100 is shown. The example method 200 is provided by way of example, as there are a variety of ways to carry out the method. The example method 200 described below can be carried out using the configurations illustrated in FIGS. 3-13, for example, and various elements of these figures are referenced in explaining the example method 200. Each block shown in FIG. 2 represents one or more processes, methods or subroutines, carried out in the example method 200. Furthermore, the illustrated order of blocks is illustrative only and the order of the blocks can change according to the present disclosure. Additional blocks can be added or fewer blocks may be utilized, without departing from this disclosure. The example method 200 can begin at block 201.

Figure 3:
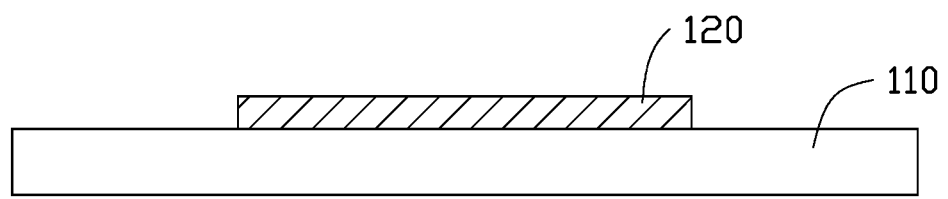
FIG. 3 is a cross-sectional view showing a structure corresponding to a first block of the method of FIG. 2.

At block 201, also referring to FIG. 3, in which the substrate 110 is provided and the gate electrode 120 is formed on the middle of the substrate 110. In more detail, the gate electrode 120 is formed by first applying a metal layer on a top face of the substrate 110. Then photolithography is used to process the metal layer to obtain a required pattern to form the gate electrode 120 on the substrate 110. The material for forming the substrate 110 can be chosen from glass, quartz, organic polymer, or other suitable transparent material. The material for forming the gate electrode 120 can be metal or other electrically conductive material, such as alloy, metal oxide, metal nitride or metal nitride oxide.

Figure 4:
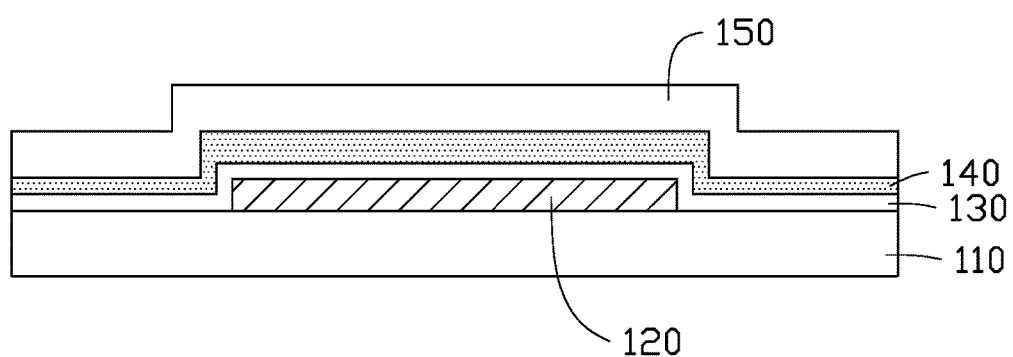
FIG. 4 is similar to FIG. 3, showing a structure corresponding to a second block of the method of FIG. 2.

At block 202, also referring to FIG. 4, the electrically insulating layer 130 is formed on the substrate 110 to totally cover the gate electrode 120. Then a semiconductor layer 140 and a first photoresist layer 150 are successively formed on the electrically insulating layer 130. The material for forming the electrically insulating layer can be chosen from inorganic material such as silicon dioxide, silicon nitride, or silicon nitride oxide, organic material or other suitable material or a combination thereof. The formation of the electrically insulating layer 130 can be achieved by plasma-enhanced chemical vapor deposition. The material for forming the semiconductor layer 140 can be chosen from amorphous silicon, polycrystalline silicon, or oxide semiconductor which is suitable for use in constructing a channel layer for a TFT. The first photoresist layer 150 is made of a positive resist which is a type of photoresist in which the portion of the photoresist that is exposed to light becomes soluble to the photoresist developer. Alternatively, the first photoresist layer 150 can be made of a negative resist.

At block 203, the first photoresist layer 150 is patterned to from a first photoresist pattern 152. The first photoresist pattern 152 is positioned corresponding to the gate electrode 120. At block 204, a portion of the semiconductor layer 140 which is not covered by the first photoresist pattern 140 is etched away to form the channel layer 142.

Figure 5:
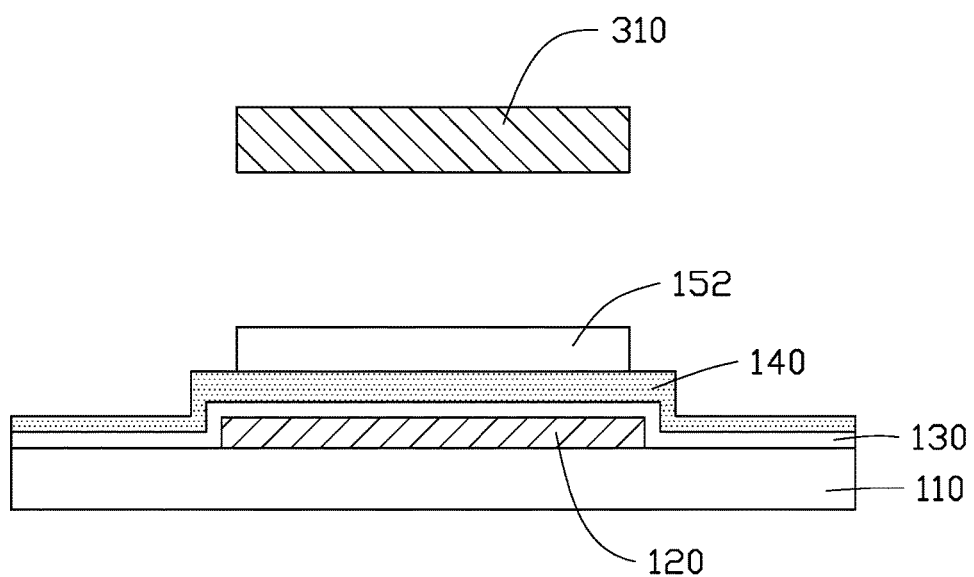
FIG. 5 is similar to FIG. 3, showing a structure corresponding to a third block of the method of FIG. 2, in accordance with a first embodiment of the present disclosure.
Figure 6:
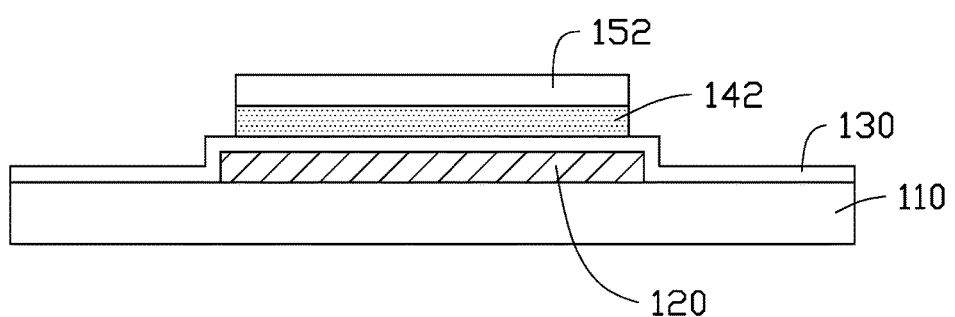
FIG. 6 is similar to FIG. 3, showing a structure corresponding to a fourth block of the method of FIG. 2, in accordance with the first embodiment of the present disclosure.
Figure 7:
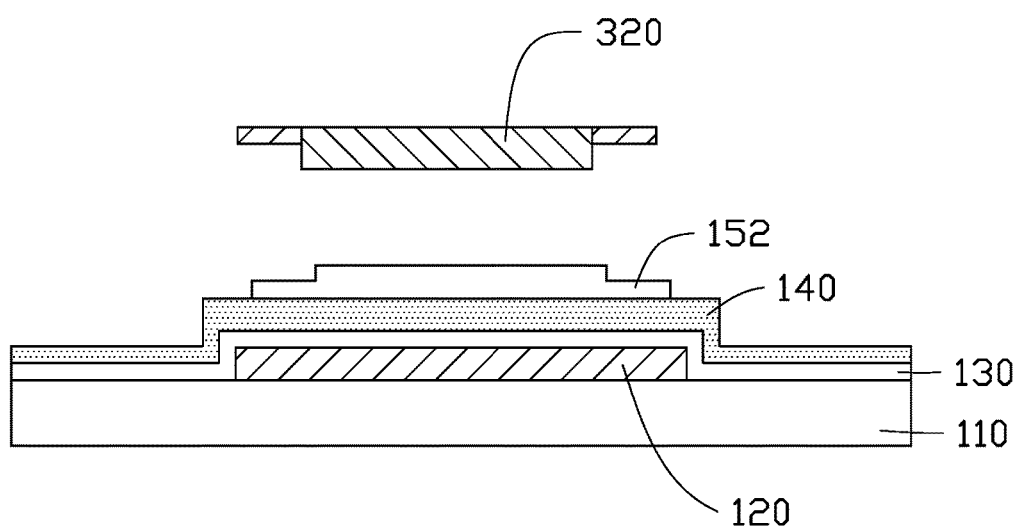
FIG. 7 is similar to FIG. 3, showing a structure corresponding to the third block of the method of FIG. 2, in accordance with a second embodiment of the present disclosure.
Figure 8:
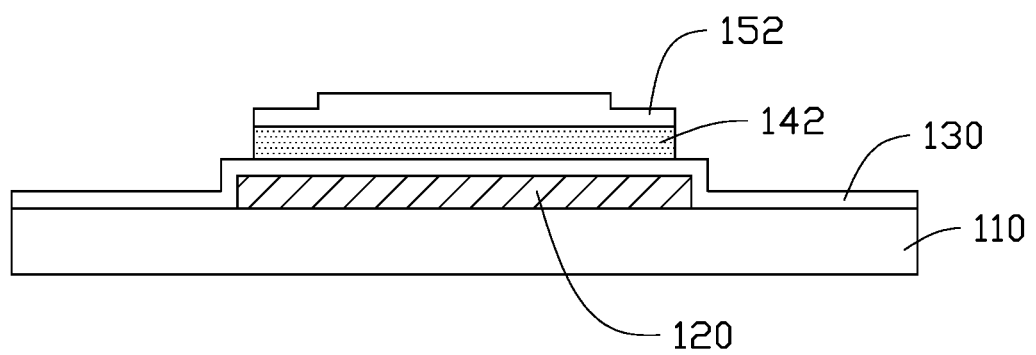
FIG. 8 is similar to FIG. 3, showing a structure corresponding to the fourth block of the method of FIG. 2, in accordance with the second embodiment of the present disclosure.

At block 205, two opposite lateral portions of the first photoresist pattern 152 are removed away to expose two opposite lateral portions of the channel layer 142. FIGS. 5 and 6 show the first photoresist pattern 152 and the channel layer 142, which are formed in accordance with a first embodiment of the present disclosure. FIGS. 7 and 8 show the first photoresist pattern 152 and the channel layer 142, which are formed in accordance with a second embodiment of the present disclosure.

Figure 9:
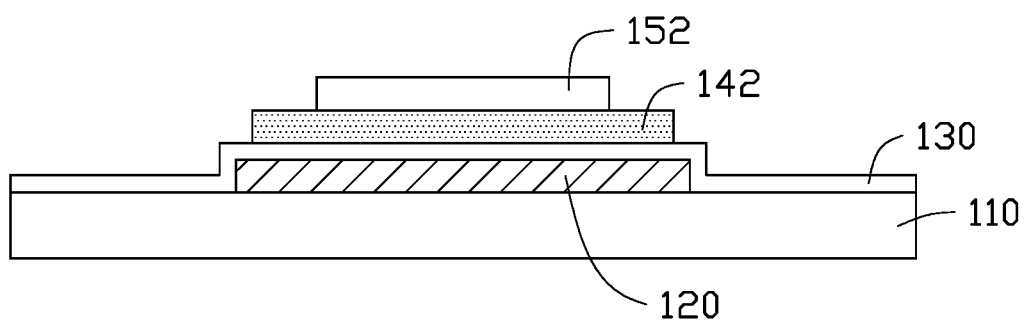
FIG. 9 is similar to FIG. 3, showing a structure corresponding to a fifth block of the method of FIG. 2.

Referring to FIG. 5, in accordance with the first embodiment, the first photoresist pattern 152 is formed by using a mask 310 and photolithography to process the first photoresist layer 150, wherein the mask 310 is located above and in alignment with the gate electrode 120. Since the mask 310 has a uniform thickness and uniform light permeability, the first photoresist pattern 152 can have a uniform thickness, as shown in FIG. 6. The processing of the photoresist layer 150 by the mask 310 and the photolithography also causes two lateral portions of the semiconductor layer 140 to be etched away to form the channel layer 142 which has two opposite sides aligned with two opposite sides of the first photoresist pattern 152. Thereafter, as shown in FIG. 9, by using an ashing process to the first photoresist pattern 152 by applying $O_2$ or $O_3$ plasma thereto, the first photoresist pattern 152 becomes shorter and thinner, whereby the two lateral portions of the first photoresist pattern 152 are removed away to expose the two lateral portions of the channel layer 142.

Referring to FIG. 7, according to the second embodiment, a mask 320 has different thicknesses and different levels of light permeability and photolithography are used to process the first photoresist layer 150, whereby the obtained the first photoresist pattern 152 can have different thicknesses in which two lateral portions of the first photoresist pattern 152 have a smaller thickness, and a middle portion thereof has a larger thickness. Light permeability of a middle portion of the mask 320 is lower than light permeability of two lateral portions of the mask 320. Accordingly, after exposure and development, the first photoresist pattern 152 can have a configuration with two different thicknesses as shown in FIG. 8. The processing of the photoresist layer 150 by the mask 320 and the photolithography also causes two lateral portions of the semiconductor layer 140 to be etched away to form the channel layer 142 which has two opposite sides aligned with two opposite sides of the first photoresist pattern 152. Then as shown in FIG. 9, by using an ashing process to the first photoresist pattern 152 by applying $O_2$ or $O_3$ plasma thereto, the two lateral portions of the first photoresist pattern 152 which have a smaller thickness are removed away, whereby the two lateral portions of the channel layer 142 are exposed.

Figure 10:
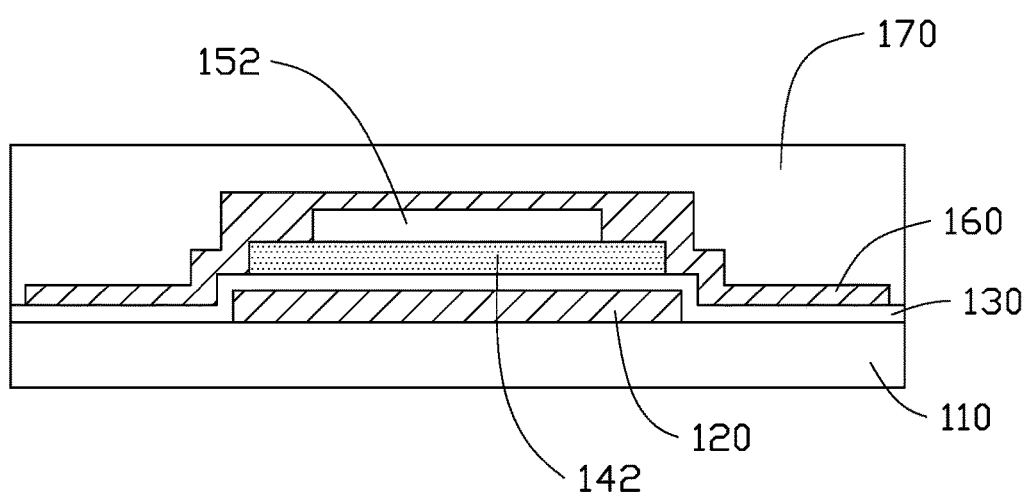
FIG. 10 is similar to FIG. 3, showing a structure corresponding to a sixth block of the method of FIG. 2.

At block 206, please also referring to FIG. 10, a metal layer 160 is formed to cover the electrically insulating layer 130, the channel layer 142 and the first photoresist pattern 152. Then, a second photoresist layer 170 is formed on the metal layer 160. The material for forming the metal layer 160 can be metal or any other electrically conductive material such as alloy, metal oxide, metal nitride or metal nitride oxide. In the present disclosure, the second photoresist layer 170 is made of a positive resist which is a type of photoresist in which the portion of the photoresist that is exposed to light becomes soluble to the photoresist developer. Alternatively, the second photoresist layer 170 can be made of a negative resist. Since the two lateral portions of the channel layer 142 are exposed through two lateral sides of the first photoresist pattern 152, the metal layer 160 is in direct contact with the two lateral portions of the channel layer 142 when the metal layer 160 is formed.

Figure 11:
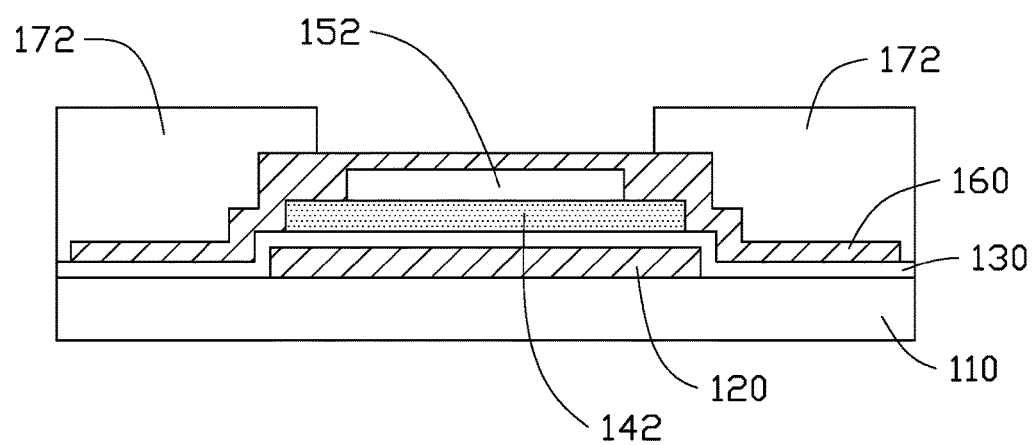
FIG. 11 is similar to FIG. 3, showing a structure corresponding to a seventh block of the method of FIG. 2.

At block 207, also referring to FIG. 11, the second photoresist layer 170 is patterned by photolithography to form a second photoresist pattern 172. The second photoresist pattern 172 is located around the first photoresist pattern 152. An inner edge of the second photoresist pattern 172 is spaced from an outer edge of the first photoresist pattern 152 with a distance with is substantially equal to one-tenth (1/10) of a length of the channel layer 142. The second photoresist pattern 172 is formed by exposure and development of the second photoresist layer 170 by using a mask (not shown).

Figure 12:
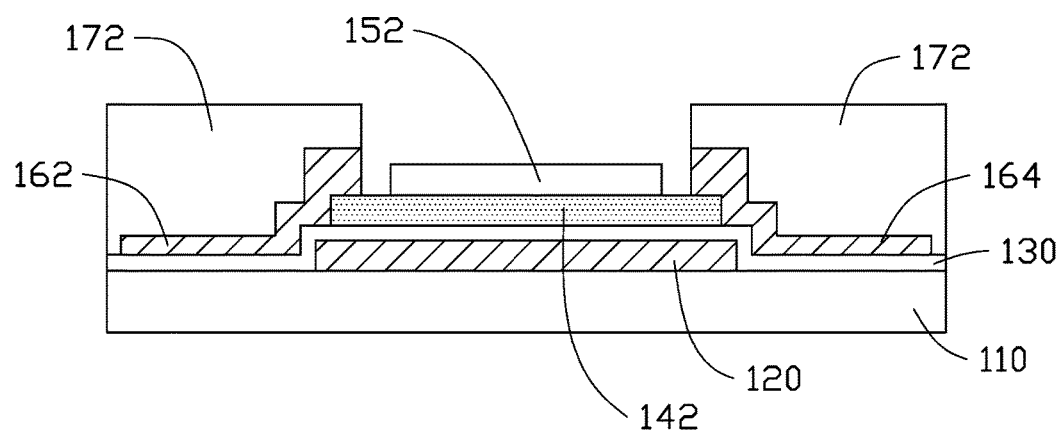
FIG. 12 is similar to FIG. 3, showing a structure corresponding to an eighth block of the method of FIG. 2.

At block 208, please referring to FIG. 12, a middle portion of the metal layer 160 which is not covered by the second photoresist pattern 172 is etched away, whereby the source electrode 162 and the drain electrode 164 are formed; a portion of the channel layer 142 which is not covered by the source electrode 162, the drain electrode 164 and the first photoresist pattern 152 is exposed. Here since the first photoresist pattern 152 covers a middle portion of the channel layer 142, the middle portion of the channel layer 142 is protected from etching which is used to etch away the middle portion of the metal layer 160.

Figure 13:
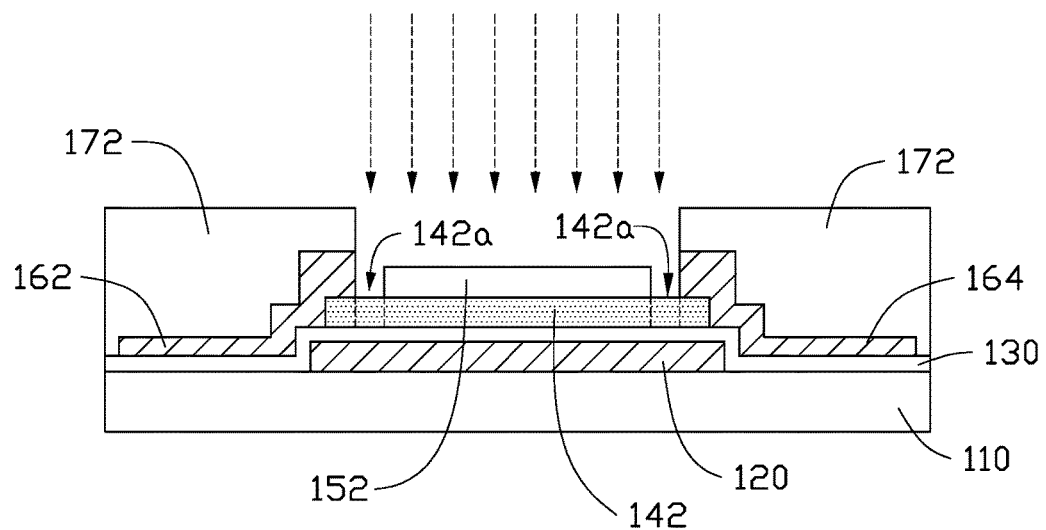
FIG. 13 is similar to FIG. 3, showing a structure corresponding to a ninth block of the method of FIG. 2.

At block 209, also referring to FIG. 13, electrical conductivity of the exposed portion of the channel layer 142 not covered by the source electrode 162, the drain electrode 164 and the first photoresist pattern 152 is lowered to form the two low conductive areas 142a. The lowering of the electrical conductivity of the exposed portion of the channel layer 142 can be achieved by implanting plasma, ions or charge carriers thereinto, to thereby increase the concentration of charge carriers in, or increase the electrical resistance of, or lower the electron migration rate in the low conductive areas 142a. Accordingly, the hot-carrier effect in the channel layer 142 can be restrained, and stability and reliability of the TFT 100 can be enhanced.

At block 210, also referring back to FIG. 1, the first and second photoresist patterns 152, 172 are removed to obtain the self-aligned metal oxide thin film transistor 100 in accordance with the present disclosure.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:
1. A thin film transistor comprising:
a substrate;
a gate electrode formed on the substrate;
an electrically insulating layer formed on the substrate and covering the gate electrode;
a channel layer made of a semiconductor material and formed on the electrically insulating layer;
a source electrode formed on a first lateral side of the electrically insulating layer, the source electrode having an inner end covering a first outer end of the channel layer and electrically connecting therewith; and
a drain electrode formed on an opposite second lateral side of the electrically insulating layer, the drain electrode having an inner end covering an opposite second outer end of the channel layer and electrically connecting therewith;
wherein the channel layer comprises a central portion, two middle portions at two sides of the central portion, and two side portions; each of the two middle portions locates between the central portion and one of the two side portions; each of the two side portions overlaps with one of the source electrode and the drain electrode; the two middle portions and the central portion do not overlap with any of the source electrode and the drain electrode; each of the two middle portions has an electrical conductivity lower than electrical conductivities of the central portion and the two side portions.

2. The thin film transistor of claim 1, wherein the two middle portions of the channel layer are formed by implanting ions therein.

3. The thin film transistor of claim 1, wherein the two middle portions of the channel layer are formed by implanting charge carriers therein.

4. The thin film transistor of claim 1, wherein the two middle portions of the channel layer are formed by implanting plasma therein.

5. The thin film transistor of claim 1, wherein the two middle portions of the channel layer have a lower electron migration rate than the central portion and the two side portions of the channel layer.

6. The thin film transistor of claim 1, wherein the two middle portions of the channel layer have an electrical resistance higher than electrical resistances of the central portion and the two side portions of the channel layer.

7. The thin film transistor of claim 1, wherein the two middle portions of the channel layer have a charge carrier concentration higher than that of the central portion and the two side portions of the channel layer.

8. The thin film transistor of claim 1, wherein the two middle portions of the channel layer have a length which is substantially equal to one-tenth of an entire length of the channel layer.

9. The thin film transistor of claim 1, wherein the channel layer is made of an oxide semiconductor material.

10. The thin film transistor of claim 9, wherein the channel layer is aligned with the gate electrode.

* * * * *